US010386204B2

(12) United States Patent
Oster et al.

(10) Patent No.: US 10,386,204 B2
(45) Date of Patent: Aug. 20, 2019

(54) INTEGRATED SENSOR AND HOMOLOGOUS CALIBRATION STRUCTURE FOR RESONANT DEVICES

(71) Applicant: Intel Corporation, Santa Clara, CA (US)

(72) Inventors: Sasha Oster, Chandler, AZ (US); Feras Eid, Chandler, AZ (US); Thomas L. Sounart, Chandler, AZ (US); Georgios C. Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/636,599

(22) Filed: Jun. 28, 2017

(65) Prior Publication Data

US 2019/0003854 A1     Jan. 3, 2019

(51) Int. Cl.
| | |
|---|---|
| *G01C 25/00* | (2006.01) |
| *G01C 19/5656* | (2012.01) |
| *G01P 15/08* | (2006.01) |
| *G01P 1/02* | (2006.01) |
| *G01P 1/00* | (2006.01) |
| *G01P 15/18* | (2013.01) |
| *G01P 15/097* | (2006.01) |
| *G01P 21/00* | (2006.01) |

(52) U.S. Cl.
CPC ........ *G01C 25/005* (2013.01); *G01C 19/5656* (2013.01); *G01P 15/097* (2013.01); *G01P 21/00* (2013.01); *G01P 1/00* (2013.01); *G01P 1/023* (2013.01); *G01P 15/0802* (2013.01); *G01P 15/18* (2013.01); *G01P 2015/084* (2013.01)

(58) Field of Classification Search
CPC ........ G01P 21/00; G01C 25/005; G01C 25/00
USPC ..................................... 73/1.37–1.38, 1.77
See application file for complete search history.

(56) References Cited

U.S. PATENT DOCUMENTS

| | | | | |
|---|---|---|---|---|
| 4,912,990 A | * | 4/1990 | Norling | G01L 1/183 73/862.59 |
| 5,095,762 A | * | 3/1992 | Holm-Kennedy | G01P 15/0802 73/382 R |
| 8,653,634 B2 | * | 2/2014 | Chiu | H01L 24/97 257/415 |
| 8,794,065 B1 | * | 8/2014 | Yang | G01P 1/023 73/493 |
| 9,661,411 B1 | * | 5/2017 | Han | H04R 1/14 |
| 2002/0017134 A1 | * | 2/2002 | Sakurai | G01C 19/56 73/504.02 |
| 2007/0017290 A1 | * | 1/2007 | Shoji | G01P 15/105 73/514.31 |
| 2007/0030600 A1 | * | 2/2007 | Shoji | G01P 15/105 360/274 |
| 2008/0192963 A1 | * | 8/2008 | Sato | H04R 19/005 381/174 |

(Continued)

*Primary Examiner* — Daniel S Larkin
*Assistant Examiner* — Anthony W Megna Fuentes
(74) *Attorney, Agent, or Firm* — Green, Howard & Mughal, LLP.

(57) ABSTRACT

An apparatus is provided which comprises: a substrate; a sensor including a sensing element, wherein the sensor is integrated within the substrate; and a calibration structure integrated within the substrate, wherein the calibration structure is to exhibit one or more physical or chemical properties same as the sensor but without the sensing element.

17 Claims, 6 Drawing Sheets

(56) References Cited

U.S. PATENT DOCUMENTS

2008/0210007 A1* 9/2008 Yamaji .............. G01C 19/5628
                                                    73/504.16
2011/0265564 A1* 11/2011 Acar ................. G01C 19/5712
                                                    73/504.08

* cited by examiner

INTEGRATED SENSOR AND HOMOLOGOUS CALIBRATION STRUCTURE FOR RESONANT DEVICES

BACKGROUND

On-chip integrated sensors typically require some form of in-situ calibration mechanism that allows the device to separate changes induced by ambient parameters such as temperature and humidity, to name a few, from changes induced in the target parameter being measured. Currently, this is done by integrating secondary temperature and humidity sensing components into the device package as near as possible to the primary sensor in order to measure the ambient parameters that affect the primary sensor's response to the target parameter, for example imposing a DC offset on the normal sensor output signal. While this approach serves to compensate the effect of the ambient or secondary parameters on the sensor output, this practice incurs several disadvantages.

For example, first, in order to correct or calibrate the sensing device readout, signal processing circuitry must include a memory having a lookup table to allow for corrections of the sensor readout. This is due to the fact that the secondary sensor structures are non-homologous to the primary sensor structure. An example is the use of thermal diodes or resistors as secondary sensors integrated into an accelerometer package. The correction algorithm executed by a microcontroller or processor must be based on measured primary sensor response behavior under controlled ambient conditions of temperature and humidity, along with calibration curves for the secondary sensors.

Second, the ambient or secondary sensing components often are discrete components, therefore comparatively large, whose incorporation into the package often requires increasing the z-height and form factor of the overall package. Additionally, multiple secondary sensors may be needed to measure multiple ambient parameters, such as temperature and humidity together. As the secondary sensors may be discrete components, there can be some difficulty in collocating the primary sensing device with multiple secondary sensors in close proximity for accurately compensating the effects of the ambient on the primary sensor.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
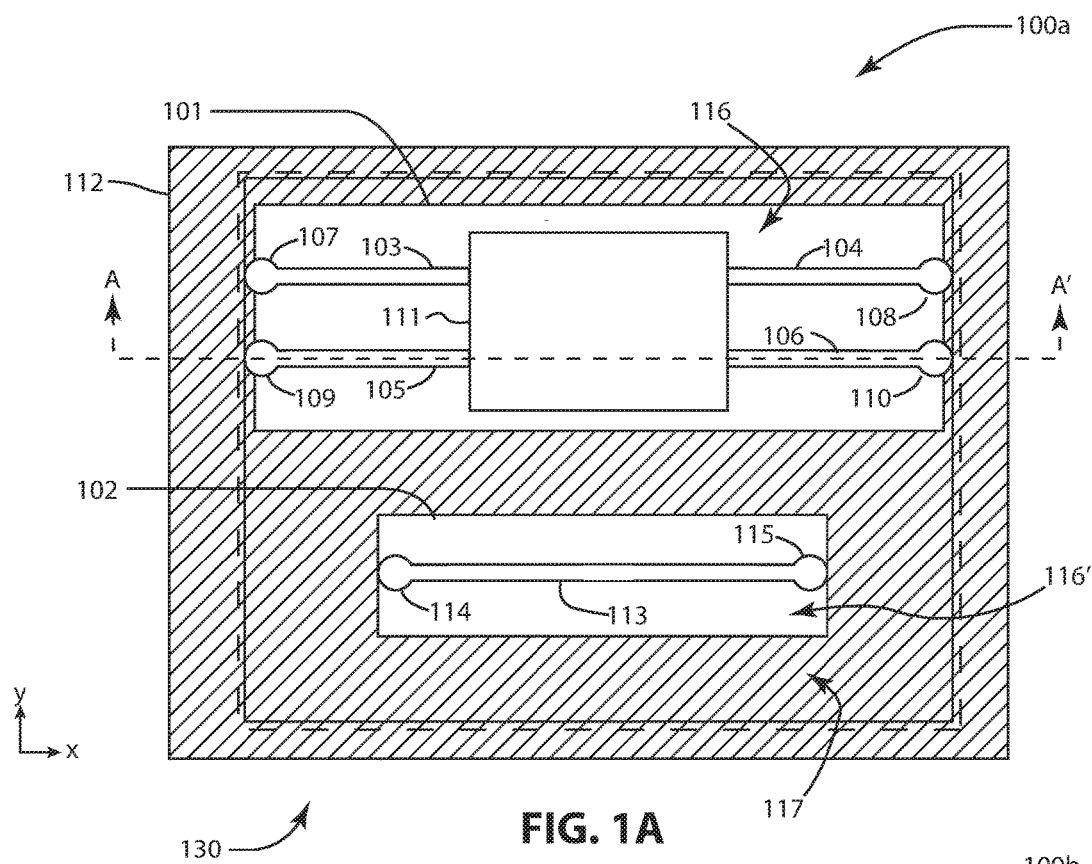
FIG. 1A illustrates a plan view of coplanar packaging architecture with one arrangement of a primary resonant sensor, according to some embodiments of the disclosure.

At the heart of certain classes of MEMS inertial sensors is a proof mass suspended by one or more electrically conductive resonant beams. The resonant beams and proof mass form a single integrated structure, whereby the beams are anchored to a surrounding package substrate that may be a silicon or composite polymer die, or directly formed within a package using a variety of techniques. Both beams and proof mass may be suspended over a cavity formed in the underlying substrate during fabrication to allow free or constrained movement of the moving parts, which comprise the resonant beams and proof mass. The beams function as weak springs attached to a comparatively massive proof mass, allowing the proof mass to displace in response to inertial forces acting upon it, while inducing tension in the beams. When functioning as an accelerometer or gyroscope, the resonant sensor structure is induced into vibration by passing an AC current through the beams in the presence of a magnetic field.

The conductive beams possess a degree of flexibility allowing them to bend in at least one plane under the influence of a stress, and are set to vibrate when excited by an alternating current traversing the beam in the presence of a magnetic field that imposes Lorentz forces on the beams. In practice, the beams are set in motion at or near their resonant frequency, where the magnitude of vibration is greatest. The excitation waveform may be generated by a current source oscillator. By Faraday's law, a counter-emf, or back-voltage, having a polarity opposite the excitation voltage but the same frequency, is induced in the conductive beams. As tension of the beams is altered due to acceleration of the attached proof mass, the resonant frequency increases, and the beam will oscillate out of phase with at the driving frequency at a lower amplitude. The measured frequency shift can be correlated to the inertial force imposed on the proof mass, yielding the rate of acceleration.

The frequency of vibration is often chosen to be at or close or near the resonant frequency of the resonant structure. When subject to an acceleration, the target metric, inertial forces act upon the proof mass, to momentarily displace it in a particular direction. The tugging force then puts extra tension on the attached vibrating beams, changing their resonant frequency. The change of resonant frequency of the beams is detected by electronic circuitry such as a phase-locked loop, and correlated to the inertial force that caused the displacement of the proof mass. However, beam tension may also be affected by mechanical stresses due to secondary environmental factors such as changes in temperature, humidity and strain within the surrounding substrate. Temperature affects the beam tension by creating a coefficient of thermal expansion (CTE) mismatch between the anchoring structure to which the beam is attached and the substrate surrounding the anchoring structure.

In some embodiments, the anchoring structure is a via embedded in a polymeric substrate. By way of example, vias for anchoring the beams are often embedded in the surrounding dielectric, which may be a polymeric dielectric substrate such as Anjinmoto Buildup Film (ABF) or epoxy resins. In other examples, inorganic substrate materials such as glass or silicon may be used as a substrate. When subject to changes in temperature, thermal expansion coefficient (CTE) mismatch between the metal via and the substrate can create thermomechanical stresses within the beams, affecting their resonant frequency. Humidity changes may also cause similar stresses on the beams by swelling and contraction of a polymeric substrate adjacent to the vias. Other factors, such as strain induced in the substrate due to tension, compression or torsion of the package may add or relax tension within the beams. The sensor signal, is therefore convoluted with secondary effects due to temperature, humidity and mechanical strain on the package. These effects act to de-calibrate the sensor, causing it to yield erroneous values of acceleration or other properties being sensed.

In current resonant sensor package architectures, these secondary effects are compensated by integrating separate, non-homologous secondary sensors into the sensor package. By non-homologous, it is meant that the secondary sensor is not related structurally or functionally to the primary sensor. For example, discrete thermal diodes or thermocouples may be incorporated into the sensor package for measuring the temperature independently. Similarly, discrete humidity or strain sensors may be incorporated into the package to calibrate the primary sensor. These sensors are non-homologous to a resonant inertial sensor such as an accelerometer, which comprises resonant beams. As a result, a larger sensor package typically is required, involving more complicated fabrication (pick and place, SMT soldering).

Moreover, the discrete secondary sensor may need to be located in a portion of the package that is dissimilar to and relatively far from the position of the primary sensor. In this way, the secondary sensor may not be exposed to the same environment as the primary sensor. Because the secondary sensor is non-homologous, extra memory is required to store a look-up table in order to cross-reference the secondary sensor signal to the secondary parameter, such as temperature, and provide a correction factor to recalibrate the primary sensor signal. Moreover, developing recalibration look-up tables may entail significant experimentation and more memory to store them. In addition, the secondary sensors typically need to be read by separate circuitry.

As described in greater detail below, MEMS resonant sensors are integrated in tandem with homologous calibration structures directly into package substrate layers in close proximity to one another, in accordance with some embodiments. In some embodiments, the resonant calibration structures and sensors may be arranged in both horizontal coplanar and vertically stacked package architectures. In some embodiments, the resonant calibration structures are homologous to the sensor in the sense that they comprise a resonant element, such as a resonant beam, identical or similar to one in the sensor, but does not respond to the target metric of the sensor. In some embodiments, due to the homologous relationship, the calibration structure responds in the same way as the resonant elements of the sensor to secondary ambient factors that affect the resonant frequency of both calibration structure and sensor.

These secondary parameters, such as temperature, humidity and mechanical strain on the sensor package, are unrelated to the target metric. In this way, in some embodiments, the changes in resonant frequency of the calibration structure that are due to these secondary parameters tracks with changes in sensor resonant frequency that are also due to the same factors. The tandem integration of the homologous structures into the same or closely-spaced layers within the package, in addition to microfabrication from the same materials, ensures that the tandem structures experience the same environment and have the same secondary response characteristics. These architectural aspects facilitate sensor accuracy. In some embodiments, relatively simple analog and/or digital circuitry may be employed for automatic correction of the sensor output by comparison of sensor and calibration structure outputs and cancelling the secondary effects from the sensor output. For the purposes of illustration, the sensor embodiments described below are inertial sensors, but it will be understood that the described inertial embodiments are a subset of resonant sensors in general. The calibration architecture described herein may be practiced with other types of resonant sensors that are affected by environmental or ambient conditions.

In the following description, numerous details are set forth, however, it will be apparent to one skilled in the art, that the present invention may be practiced without these specific details. In some instances, well-known methods and modules are shown in block diagram form, rather than in detail, to avoid obscuring the present disclosure. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined anywhere with a second embodiment where the particular features, structures, functions, or characteristics associated with the two embodiments are not mutually exclusive.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For the purposes of the embodiments, reference to a specific plane, direction or orientation is referred to axes of a coordinate system clearly shown in the drawing. In this manner, the disposition of certain elements relative to others is unambiguous. For instance, phrases such as "along the x axis" or "along the z-axis" will used to emphasize the orientation of elements or a plane represented in a particular drawing. "Horizontal" and "vertical" are used in reference to the plane of a substrate (xy plane) in which or on which structures are integrated, where "horizontal" is parallel to the plane of the substrate, and "vertical" is orthogonal to the plane of the substrate. "Coplanar" is used interchangeably with "horizontal". "Stacked" is used interchangeably with "vertical".

The terms "over," "under," "between," and "on" as used herein refer to a relative position of one component or material layer with respect to other components or layers where such physical relationships are noteworthy. For example, in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Current microelectronics terminology and processes known to persons of ordinary skill in the art will be used in this disclosure. As an example, frequent reference to the term "MEMS" will be used in this disclosure, which is the well-known acronym for "Micro-Electromechanical Systems". In many cases, the term "MEMS" is used as an adjective, such as a "MEMS sensor", referring to the fact that the device is a miniaturized version of classical devices (made by conventional manufacturing methods), and fabricated by micromachining techniques. Terminology that is used in current microelectronics fabrication processes will also be used in this disclosure, and it is understood that the terminology is standard in the microelectronics industry. In some cases, acronyms and abbreviations used in the industry will be spelled out for clarification.

The term "resonant inertial sensor" and "resonant calibration structure" is used frequently in this disclosure. The term "Inertial sensor" generally refers to MEMS sensors that respond to and measure inertial forces, such as MEMS accelerometers and gyroscopes. The term "resonant" generally refers to the fact that operation of the class of device described relies on moving structures that vibrate at or near their mechanical resonant frequency. The term "Resonant inertial sensor" generally refers to a class of inertial sensor, such as an accelerometer or gyroscope, comprising resonant elements that are set into vibratory motion at or near the resonant frequency of the vibrating elements or parts. It will also be understood that all sensors and structures described herein are MEMS devices and structures, hence the "MEMS" adjective will be mostly omitted in the description. The term "resonant" here is generally is used adjectively to emphasize the fact that a mechanical structure of a device may be set into vibratory or oscillatory motion, not necessarily at or near a resonant frequency, such as "resonant inertial sensor".

The term "homologous" is generally used in this disclosure. Here, the term "homologous" is used in a relative sense and refers to structures of one device that are derived from another device. For the purpose of this disclosure, a calibration structure is described that comprises one or more resonant elements, such as one or more resonant beams comprised by a resonant inertial sensor, such as a MEMS accelerometer. A non-analogous device or element is used as a relative term to mean that one device does not comprise elements derived from another element. For example, a resonant accelerometer having vibrating structures, and a thermal diode that has no moving parts, are non-homologous devices, although the thermal diode may be employed in a circuit to calibrate the accelerometer.

FIG. 1A illustrates a plan view 100a of coplanar packaging architecture with one arrangement of a primary resonant sensor, according to some embodiments of the disclosure.

In coplanar package architecture embodiments of the present disclosure, the primary sensor and calibration resonant structures are formed within the same layer of the package, being of the same material and thickness. In stacked package architectural embodiments, the sensor and calibration structures are formed in separate package layers. An example of the coplanar architecture is shown by the plan view (xy plane) of substrate 130 in FIG. 1A. Primary resonant sensor 101 is aligned with calibration structure 102 along the z-axis of the figure. It will be appreciated that the particular alignment of the primary sensor 101 and calibration structure 102 is chosen for illustrative purposes, and not limiting as depicted. Other suitable arrangements are also possible.

In some embodiments, resonant sensor beams 103-106 span the distance between vias 107-110, respectively (e.g., one beam per via) and proof mass 111. In some embodiments, beams 103-106 and proof mass 111 form a resonant structure. In some embodiments, vias 107-110 are embedded in dielectric 112, and provide both mechanical anchoring for beams 103-106, as well as electrical connections for the beams. In some embodiments, dielectric 112 may be a thermoplastic polymer resin, such as an epoxy resin, that is cast over a patterned substrate. A variety of materials are known to the art that can be used for dielectric 112. In many microelectronics and MEMS fabrication processes known in the art, dielectric 112 may be an ABF (Anjinomoto Buildup Film) layer, introduced as a dry film laminate for layer build-up, as used in the BBUL process. Other dielectric layers may also be introduced, by spin coating, casting, and application of other dry film laminates. In these processes, vias are grown by electrochemical deposition techniques, as will be described below. Dielectric 211 may provide structural rigidity and support within the package, as well as electrical and thermal isolation between conducting components, among other purposes In some embodiments, beam 113 of calibration structure 102 spans the distance between vias 114 and 115 and is anchored to these vias, which provide the same functions as vias 107-110. In some embodiments, both primary resonant sensor 101 and resonant calibration structure 102 are suspended over separate cavities 116 and 117, respectively, allowing the beans to oscillate and proof mass to undergo displacement unimpeded. In some embodiments, a single cavity may be common to both sensors. In some embodiments, a permanent magnet is provided in a separate layer, where the magnet is stacked over or under the sensor pair. In this way, both primary sensor 101 and calibration structure 102 are exposed to the same magnetic field B.

In FIG. 1A, this is indicated by the broken outline surrounding sensors 101 and 102. In other related embodiments, an electromagnet may be similarly disposed. In further embodiments not shown here, one or more magnets may be disposed in the same layer and adjacent to the sensor pair for optimized field B around the sensor pair.

Figure 1B:
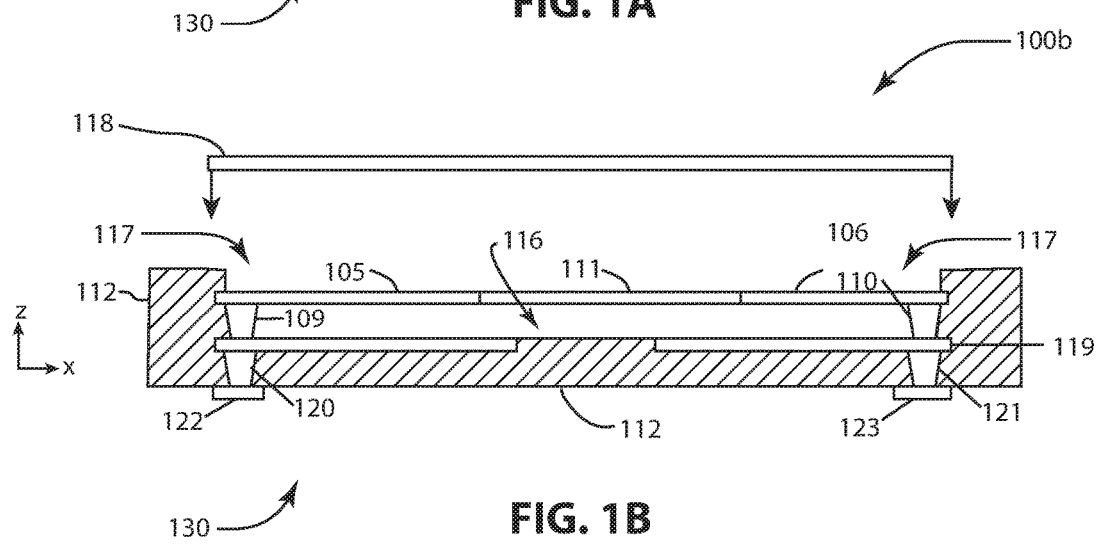
FIG. 1B illustrates a cross-sectional view of the coplanar packaging architecture showing the vertical arrangement of resonant structures of the sensor pair embedded within the substrate, according to some embodiments of the disclosure.

FIG. 1B illustrates a cross-sectional view 100b of the coplanar packaging architecture showing the vertical arrangement of resonant structures of the sensor pair embedded within the substrate, according to some embodiments of the disclosure.

In FIG. 1B, a cross-sectional view of a particular embodiment of the coplanar architecture is provided, where the plan view of substrate 130 has been rotated 90 degrees into the plane of the figure, exposing the xz plane and the vertical relationship of the parts just described. For clarity, only primary sensor 101 is shown along cut AA' in FIG. 1A, with beams 103 and 104 below the plane of the figure and not visible in the view.

Referring to FIG. 1B, beams 105 and 106 are shown attached to vias 109 and 110, respectively, at a first end, and to proof mass 111 at a second end. Vias 109-110, as well as vias 107-108 below the plane of the figure, are embedded in dielectric 112 for mechanical support. In accordance with FIG. 1A, sensor layer comprising beams 105-106 and proof mass 111 is disposed in cavity 116. In some embodiments, cavity 116 may be produced in one or more layers of dielectric 112 by microfabrication methods discussed below. In some embodiments, the formation of cavity 116 is used to release the moving structures of the resonant sensor pair from underlying substrate. In some embodiments, an upper cavity 117 is delineated by the solid rectangle surrounded by the broken rectangular outline in the figure. Structures shown within the solid rectangle delineated cavity 117 are sunken below the plane of the figure, and the margin of substrate 130 in the plan view. In some embodiments, a magnet 118 may be stacked over the sensor layer as indicated in FIG. 1A, requiring the cavity 117 to vertically separate magnet 118 from the sensor layer.

Referring back to FIG. 1B, in some embodiments, magnet 118 is disposed on the top surface of sensor package 100 directly over the sensor layer, and may be adhered to substrate 112 along the margin of dielectric substrate 112 surrounding cavity 117. In some embodiments, the sensor layer is disposed on the top layer of the substrate, using a single cavity below the sensor layer. In some embodiments, one or more magnets may be disposed laterally adjacent to the sensors on the top surface of the substrate in a coplanar configuration with respect to the sensors, or embedded in the substrate in a layer below the sensor layer. In some embodiments, primary sensor 101 and calibration structure 102 share the same cavity or cavities disposed below and above the sensor layer.

In some embodiments, electrical interconnects are made from sensor beams 105-106 to lower conducting layer 119 by vias 109 and 110. In some embodiments, layer 119 may comprise horizontal traces (escape routing) leading to other components within the package substrate 100, or to contact pads. In some embodiments, layer 119 is further vertically coupled to a lower conducting layer by vias 120 and 121, both embedded in dielectric 112, connecting to pads or traces 122 and 123 on the lower surface of package substrate 130.

Figure 2A:
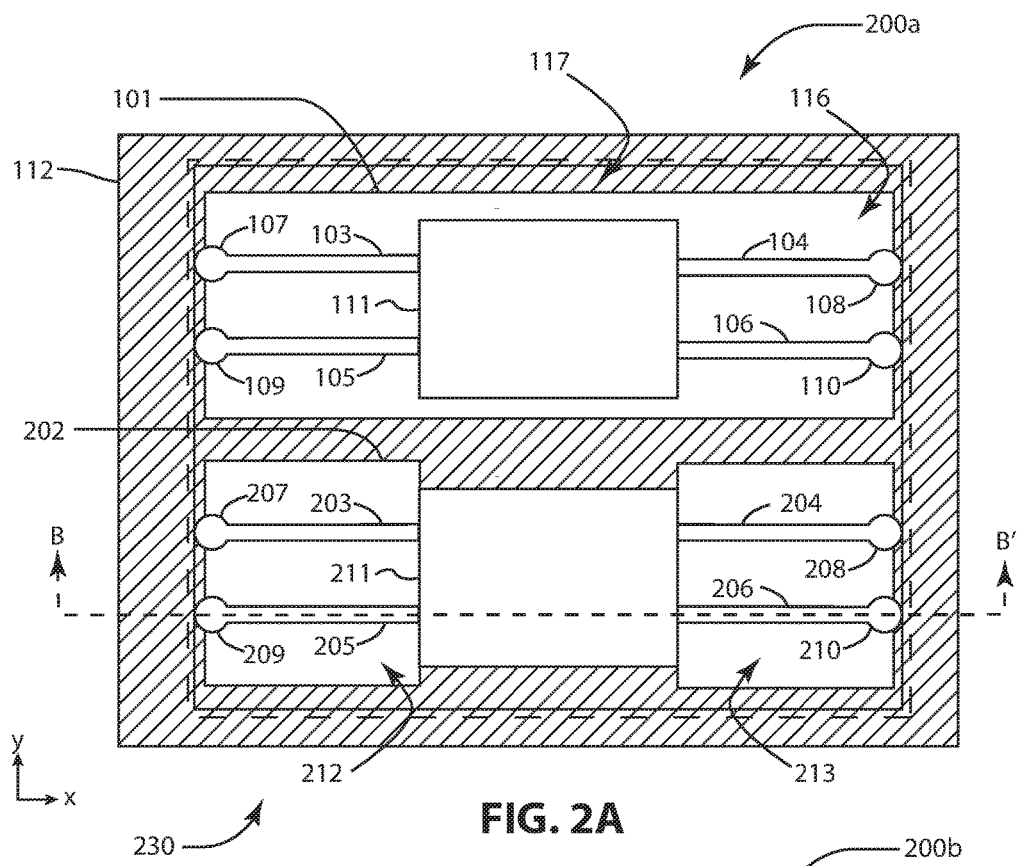
FIG. 2A illustrates a plan view of the coplanar packaging architecture with the same arrangement of a primary resonant sensor, according to some embodiments of the disclosure.

FIG. 2A illustrates a plan view 200a of the coplanar packaging architecture with the same arrangement of a primary resonant sensor, according to some embodiments of the disclosure. FIG. 2A again shows a similar coplanar architecture plan view 200a for primary sensor and calibration structure as in FIG. 1A, however featuring an alternative calibration structure embodiment. The primary sensor is the same description as in FIG. 1A, therefore the following discussion will focus on the calibration structure. Referring to FIG. 2A, calibration structure embodiment 201 comprises four resonant beams 203-206 extending from vias 207-210 to central structure 211. As with the previous embodiments, vias 207-210 are bonded to resonant beams 203-206 and anchor these to dielectric substrate 112. In some embodiments, central structure 211 resembles proof mass 111, however it remains bonded to substrate 112, and therefore immobile. In some embodiments, the entire calibration structure 202 resembles resonant sensor 101 having four beams extending from opposing sides of central structure 211 and suspended across separate cavities 212 and 213 flanking central structure 211 and underlying dielectric substrate 112. While central structure 211 is immobile, resonant beams 203-206 are free to vibrate, in accordance with some embodiments. In some embodiments, upper cavity 117 is present and encompasses structures 101 and 201, which are sunken below the plane of the figure as in FIG. 1A.

Figure 2B:
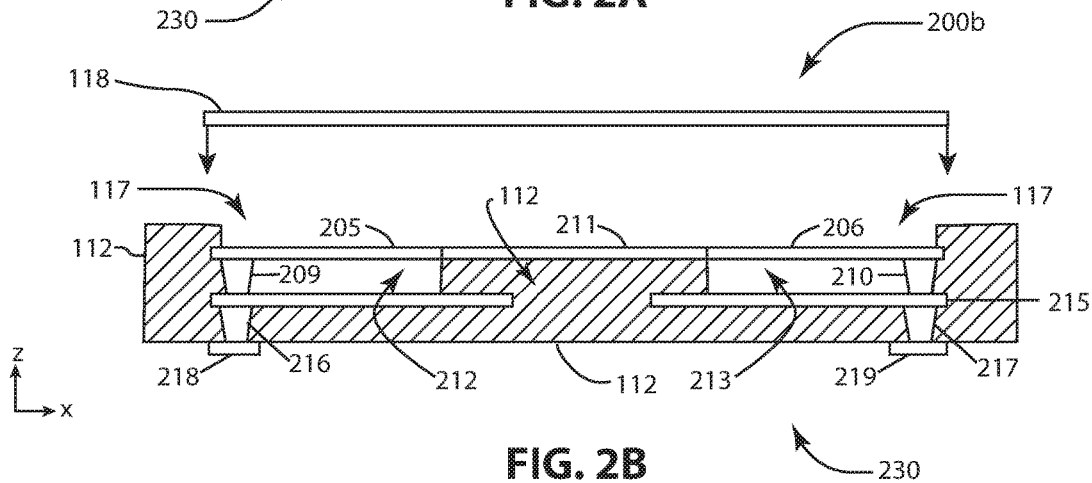
FIG. 2B illustrates a cross-sectional view of the coplanar packaging architecture showing the vertical arrangement of resonant structures of the sensor pair embedded within the substrate, according to some embodiments of the disclosure.

FIG. 2B illustrates a cross-sectional view of the coplanar packaging architecture showing the vertical arrangement of resonant structures of the sensor pair embedded within the substrate, according to some embodiments of the disclosure.

FIG. 2B is a cross-sectional view of the structures described for FIG. 2A taken along cut BB'. As can be seen in FIG. 2B, central structure 211 is bonded to underlying dielectric substrate 112, separating calibration structure 202 into two portions. In some embodiments, resonant beams 205 and 206 are suspended across cavities 212 and 213, respectively. Although not visible in the figure, beams 203 and 204 are similarly disposed behind beams 205-206. In some embodiments, anchoring vias 209 and 210 to which beams 205-206 are bonded extend to lower conductive layer 215. In some embodiments, trace routing is provided in conductive layer 215 as shown in FIG. 2B, transporting signals two and from all vias 207-210 and resonant beams 203-206. In some embodiments, vias 216 and 217 extend from conductive layer 215 to contact pads or traces 218 and 219, respectively, disposed on the bottom of package 200b.

Figure 3A:
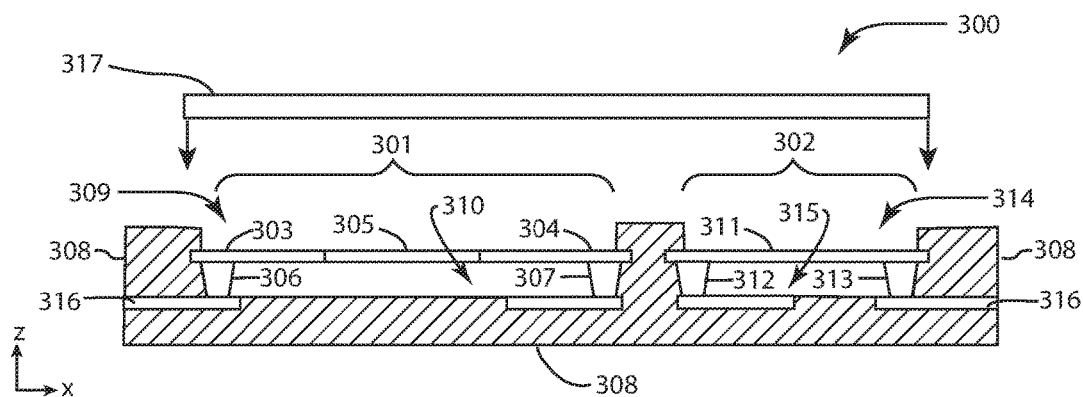
FIG. 3A illustrates a cross-sectional view of the coplanar architecture showing the primary resonant sensor and calibration structure disposed in a side-by-side horizontal configuration, according to some embodiments of the disclosure.

FIG. 3A illustrates a cross-sectional view of the coplanar architecture 300, showing the primary resonant sensor and calibration structure disposed in a side-by-side horizontal configuration, according to some embodiments of the disclosure.

In FIG. 3A, the cross-section view of the package portion 300 shows a particular architectural embodiment where primary sensor 301 is aligned with reference sensor 302 along the x-axis of the figure. It will be appreciated that the particular alignment of the resonant sensor and calibration structures is chosen for illustrative purposes, and not limiting as depicted. Other suitable arrangements are also possible. In some embodiments, resonant sensor 301 comprises resonant beams 303-304 and proof mass 305, which is disposed in the same conducting layer the beams. Beams 303 and 304 extend from both sides of proof mass 305 and are anchored by vias 306 and 307, respectively. In some embodiments, vias 306-307 are embedded in dielectric 308. In some embodiments, cavities 309 and 310 are respectively disposed above and below resonant sensor 301 for reasons discussed above. In some embodiments, calibration structure 302 is shown as a single resonant beam 311 without a proof mass attached. In some embodiments, more than one resonant beam may be comprised by calibration structure 302. In some embodiments, resonant beam 311 is anchored to vias 312 and 313, which are embedded in dielectric substrate 308. In some embodiments, vias 312 and 313 also serve as electrical connections for beam 311. In some embodiments, cavities 314 and 315 are respectively disposed above and below calibration structure 302. In some embodiments, escape trace routing 316 is provided in a lower conductive layer to connect the beams to external electrical contacts. In some embodiments, magnet 317 is positioned above sensors 301 and 302 and may cover both sensors, as in the embodiment of FIG. 3A. The down-pointing arrows below magnet 317 indicate that the magnet is attached to substrate 320.

Figure 3B:
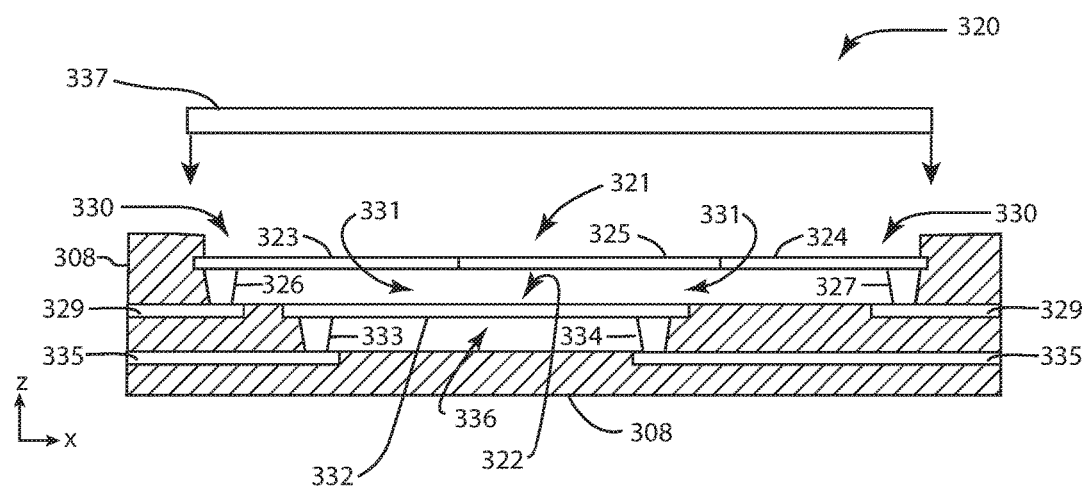
FIG. 3B illustrates a cross-sectional view of the stacked architecture showing the primary resonant sensor and calibration structure disposed vertically, according to some embodiments of the disclosure.

FIG. 3B illustrates a cross-sectional view of the stacked architecture 320, showing the primary resonant sensor and calibration structure disposed vertically, according to some embodiments of the disclosure.

A stacked package architecture embodiment 320 is shown in the cross-sectional view of FIG. 3B, where primary sensor 321 and calibration structure 322 are disposed vertically in adjacent layers in package 320. In some embodiments, primary sensor 321 comprises beams 323-324 extending from proof mass 325 and anchored to vias 326 and 327, respectively. It is understood that some structural details of primary sensor 321 are not shown in the cross-sectional view of FIG. 3B, and that structures such as beams below the plane of the figure are not visible, however their presence is implicit. Although reference numerals indicate visible structures, such as beams, they can also implicitly refer to related structures such as beams that are not visible in the plane of the figure. In some embodiments, vias 326-327 are embedded in dielectric substrate 328, and extend to lower conductive level 329. In some embodiments, escape routing is provided by conductive level 329 for conduction of signals to and from vias 326-327 and beams 323-324.

Still referring to FIG. 3B, in some embodiments beams 323-324 and proof mass 325 are formed integrally in the same conductive layer. In some embodiments, conductive layers in which the structures described are formed are made from an electrically conductive material, such as copper film or foil (as described by the process flow later in this disclosure). In some embodiments, sensors structures may be fabricated from any metal, semimetal or semiconductor material that be caused to deflect elastically when carrying ac current in the presence of a magnetic field. In some embodiments, above and below primary sensor 321 are first and second cavities 330 and 331, serving to suspend sensor 321 between vias 326-327 and allow free movement of beams 323-324. In some embodiments, calibration structure 322 comprises beam 332 that is formed within conductive layer 229 and disposed below primary sensor 321, at the bottom of cavity 331. In some embodiments, calibration structure 322 is bonded and anchored to vias 333 and 334, also embedded in dielectric substrate 328. In some embodiments, vias 333-334 extend through dielectric substrate material 328 to lower conductive layer 335, which again provides escape routing that conducts electrical signals to and from vias 333-334 and beam 332. In some embodiments, a third cavity 336 is disposed below calibration structure 322, formed between conductive levels 331 and 335. Cavity 236 as well as cavity 331 serve to allow suspension of beam 332 between vias 333-334. In some embodiments, cavity 330 is not separate from cavity 331; in some embodiments, cavity 336 is an extension of cavity 331, thus cavities 330-331 and 336 are portions of a single cavity in some embodiments.

In some embodiments, magnets may be disposed in strategic positions in proximity of sensors 321 and 322 to provide optimal field coverage of both sensors as described above. In the embodiment shown in FIG. 3B, magnet 337 is disposed above stacked sensors 322 and 323. The down-pointing arrows near the edges of magnet 337 indicate that it is attached to substrate 308. For clarity, magnet 337 is removed from the substrate. In the embodiment of FIG. 3B, cavity 330 serves to separate primary sensor 321 from magnet 337. Magnet 337 provides a magnetic (B) field encompassing both sensor beams 323-324 and calibration beam 332. In certain embodiments, magnet 337 is a permanent magnet, and in other embodiments, magnet 337 is an electromagnet.

A process flow for microfabricating an exemplary device package containing a sensor and calibration structure will now be described with reference to FIGS. 4A-G.

Figure 4A:
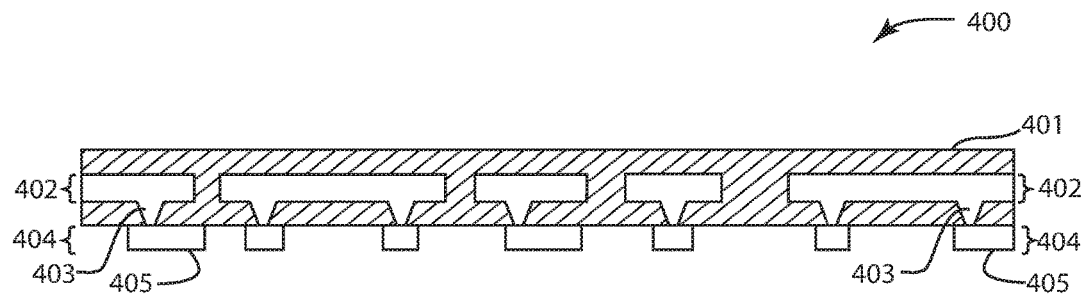
FIGS. 4A-4G illustrate microfabrication process steps for developing the side-by-side coplanar architecture, according to some embodiments of the disclosure.
Figure 4B:
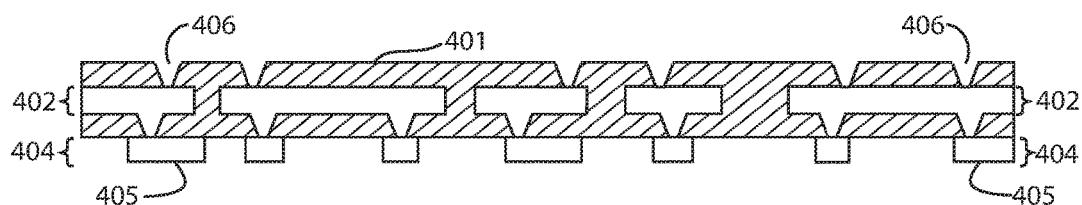

As a starting point, a partial build of an exemplary package 400 is shown in FIG. 4A. Preceding steps that have led to the build shown in FIG. 4A have been omitted for clarity. In some embodiments, dielectric 401 encases embedded structures which among other components include conductive layers, here exemplified by embedded structures formed in conductive level 402. In some embodiments, conductive level 402 is coupled by vertical vias 403 to conductive level 404, which may be the first conductive level of the package buildup in some embodiments. In previous steps not shown here, the external conductive level has been patterned and etched to form interconnect contact pads and traces 405. Continuing with the package buildup, in some embodiments, holes 406 are made in dielectric 401 at positions where vertical vias are to be fabricated. In some embodiments, holes 406 terminate at conductive level 402. Holes 405 may be formed by several methods known in the art, such as laser drilling. Patterned resist techniques may be employed as well, where dry or wet etching methods may be utilized to produce the holes.

Figure 4C:
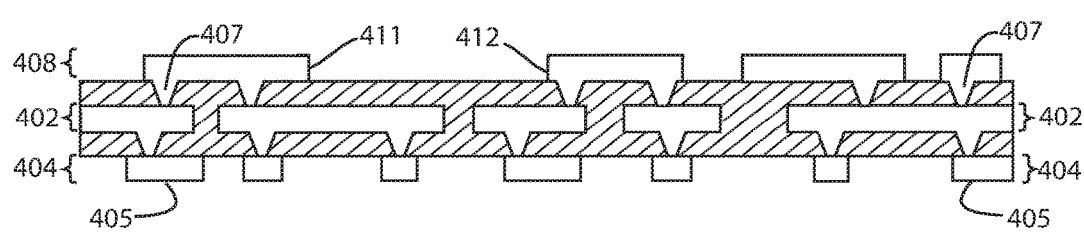

In FIG. 4C, a metallization step fills holes 406 with vias 407 connecting second conductive level 402 with a third conductive level 408, also produced the metallization or plating step, in accordance with some embodiments. In many known processes, the metallization or plating step may be a combination of a first seed layer made by metal sputtering, evaporation, or electroless deposition.

Subsequently a plated thick metal layer, including vias 407 production by filling holes 405, may be accomplished, for example, by electrodeposition in an electrochemical bath, or by further electroless deposition. Vacuum techniques may be used as well, such as sputtering. Copper is most commonly used as conductive material, however, metals such as aluminum, nickel or gold may also be plated.

Figure 4D:
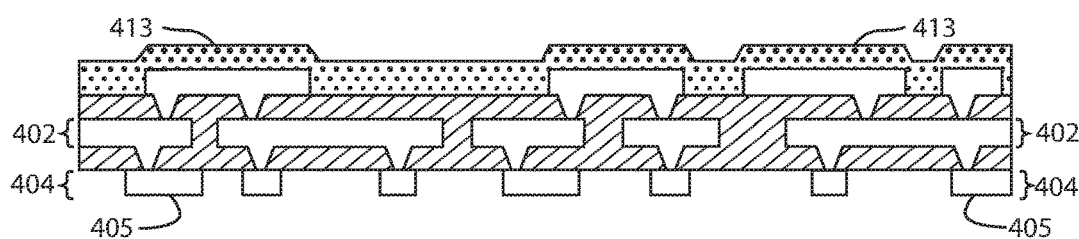
Figure 4E:
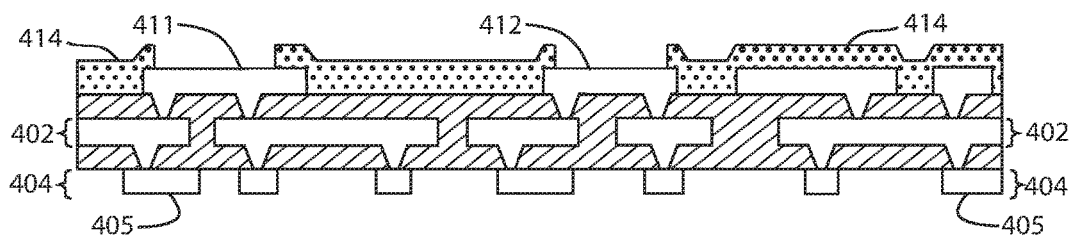
Figure 4F:
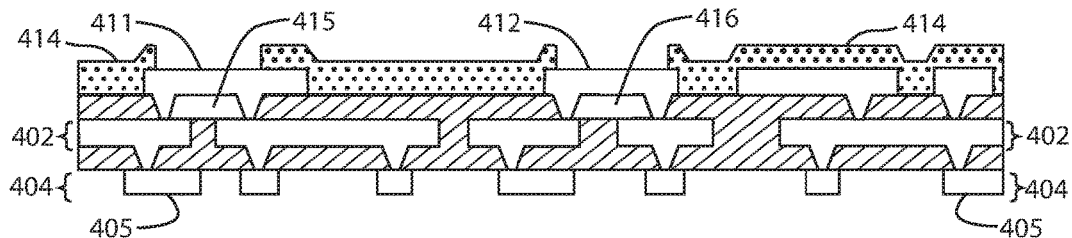

In order to release the movable structures, the underlying dielectric material is to be removed by an etch procedure. In FIG. 4D, resist 413 is deposited over the etched features of patterned conductive layer 408, in accordance with some embodiments. Resist 413 is patterned into mask 414 as shown in FIG. 4E, exposing a region surrounding sensors 411-412, in accordance with some embodiments. The exposed areas are not visible in the figure, but are large enough to allow cavities to be etched around and under sensors 411-412.

Figure 4G:
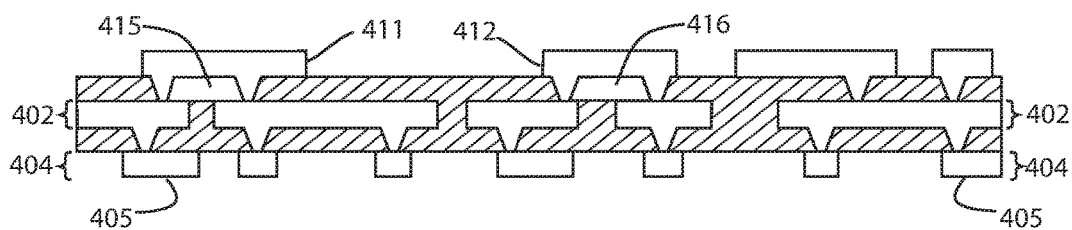

In FIG. 4G, the package is subject to an etch step that selectively removes the dielectric, undercutting the metal features and evacuating dielectric material forming cavities 415 and 416, in accordance with some embodiments. In this manner, beams and proof mass of the sensors structures have been released and are free to move. The etch process may be a dry or wet etch process. Finally, FIG. 4G shows the completed package cross section after mask 414 has been removed.

Figure 5:
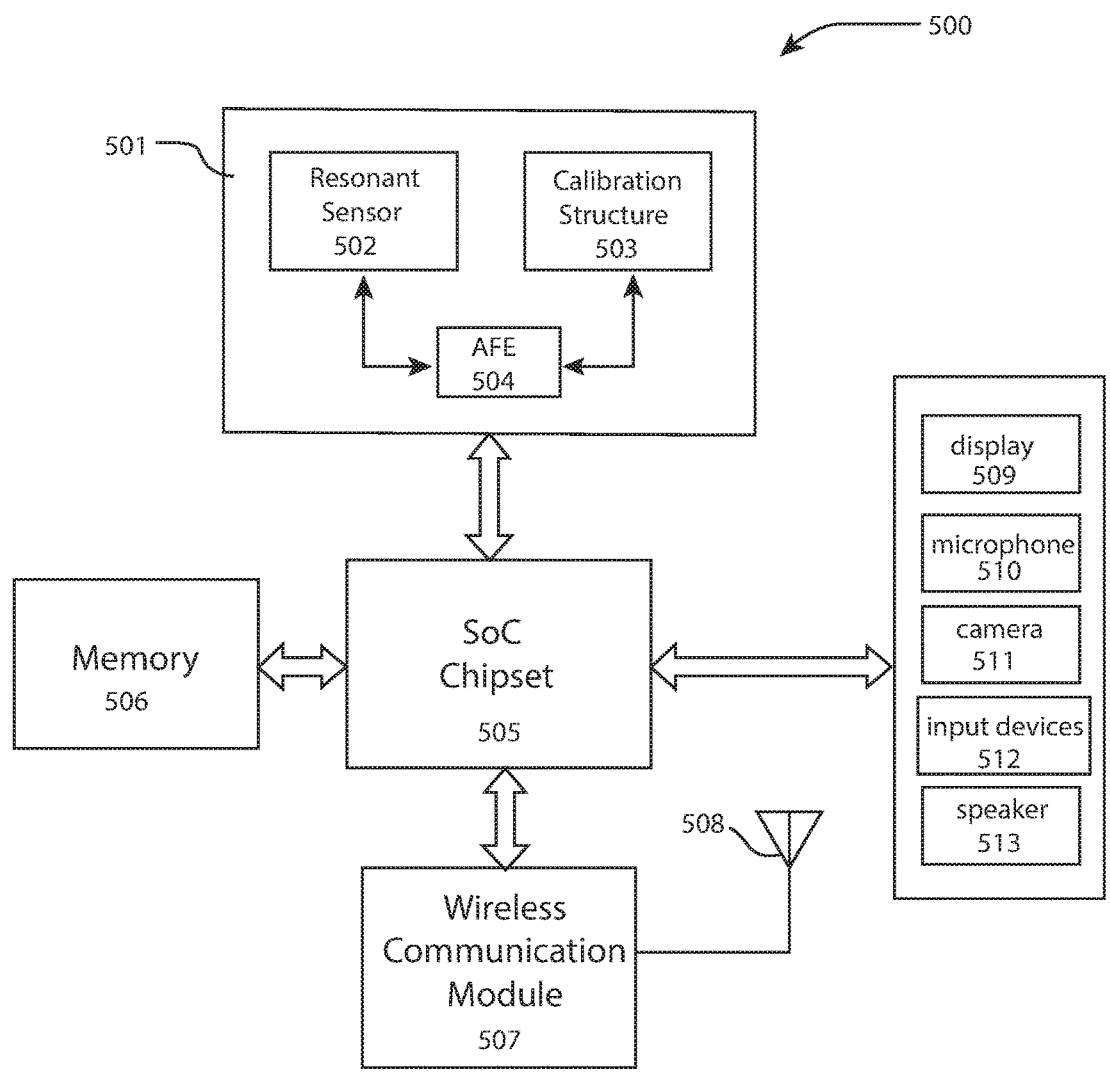
FIG. 5 illustrates a block diagram of a SoC (System-on-Chip) comprising the package containing the primary resonant sensor and resonant calibration structure, according to some embodiments of the disclosure.

FIG. 5 shows a block diagram showing a communication system 500, incorporating sensor package 501, in accordance with some embodiments. In some embodiments, communication system is a mobile device. Sensor package 501 is shown comprising resonant sensor 502 and calibration structure 503. In some embodiments, resonant sensor 501 may be an inertial sensor such as a MEMS accelerometer or gyroscope, as described in the disclosed embodiments. In some embodiments, other classes of resonant sensors may be considered without departing from the scope and spirit of the innovation. Electrical excitation of the resonant mechanical structures contained within resonant sensor 502 and calibration structure 503 and readout of the analog output signals (voltage) from resonant sensor 502 and calibration structure 503 is represented by the double-arrow connector lines between the MEMS structures and analog front end (AFE) 504. In some embodiments, AFE 504 comprises current or signal source circuitry as well as voltage reading circuitry. In some embodiments, AFE 504 may output an analog voltage or may have on-board analog to digital converters to digitize the analog signals and route them to a processor onboard the system on chip (SoC) module 505. Double-arrow connectors link SoC 505 to memory module 506 and RF wireless communications module 507, coupled to RF antenna 508.

In an exemplary operation of sensor system 500, outputs from resonant sensor 502 and calibration structure 503 are the same type of signal, for example, an alternating current signal. In some embodiments, AFE 504 may comprise a single circuit to receive a first signal from sensor 502 and a second signal from calibration structure 503. In some embodiments, AFE 504 may comprise an AC voltage or current signal source to drive the resonant beams, or the drive signal may be generated digitally with a DAC (digital to analog converter).

In some embodiments, AFE 504 may comprise circuitry measure the resonant frequency of resonant sensor 502 and of calibration structure 503 based on the first received signal and the second received signal, respectively. In some embodiments, SoC module 505 may detect contributions to the resonant frequency of sensor 502 due to secondary environmental factors, such as temperature, humidity and mechanical strain by monitoring changes in the resonant frequency of calibration structure 503. In some embodiments, SoC module 505 may recalibrate sensor 502 by comparison of changes in resonant frequency of sensor 502 to changes in resonant frequency of calibration structure 503, which are due entirely to secondary environmental factors.

In some embodiments, memory module 506 comprises a calibration look-up table correlating the resonant frequency of resonant sensor 502 to inertial forces measured in a controlled environment. In some embodiments, changes in resonant frequency of calibration structure 503 are subtracted from changes in the resonant frequency of resonant sensor 502 to deconvolute the effects of secondary environmental factors on the resonant frequency of sensor 502 from the response of senor 502 to inertial forces. In some embodiments, resonant sensor 502 is an accelerometer. In some embodiments, resonant sensor 502 is a gyroscope. The change in resonant frequency may be measured using a variety of techniques. In some embodiments, resonant frequencies may be monitored by a phase-locked loop circuit.

In some embodiments, sensor package 501 may be incorporated into a mobile device comprising wireless communication module 507 coupled to RF antenna 508. In some embodiments, SoC module 505 is coupled to peripheral components of communications system 500. According to some embodiments, communications system 500 comprises display 509, microphone 510, camera 511, input devices 512 and speaker 513. In some embodiments, communications system 500 is a smart phone. In some embodiments, communications system 500 is a tablet. In some embodiments, communications system 500 is a computer. It is understood also that in some embodiments, communications system 500 may be a component in a transportation device, such as an automobile or aircraft.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a substrate; a sensor including a sensing element, wherein the sensor is integrated within the substrate, and a calibration structure integrated within the substrate, wherein the calibration structure is to exhibit one or more properties same as the sensor but without the sensing element.

Example 2 includes all features of example 1, wherein the sensor is to exhibit a first indication corresponding to a state of a first stimulus to which the apparatus is subjected.

Example 3 includes all features of example 2, wherein the first indication is modulated by changes corresponding to a state of a second stimulus to which the apparatus is subjected.

Example 4 includes all features of example 3, wherein the calibration structure is to exhibit a second indication corresponding to the state of the second stimulus to which the apparatus is subjected.

Example 5 includes all features of any of examples 1-4, wherein the calibration structure is at least partially homologous to the sensor.

Example 6 includes all features of example 1, and further comprises circuitry to receive: a first signal from the sensor; and a second signal from the calibration structure.

Example 7 includes all features of example 6, wherein the circuitry is to compare the first signal from the sensor to the second signal from the calibration structure and to calibrate the first signal based on the second signal.

Example 8 is an apparatus that comprises: a sensor structure including a sensing element integrated within a substrate, the sensor structure is to exhibit an output signal corresponding to a state of at least one primary stimulus to which the apparatus is subjected; and a calibration structure integrated within said substrate, wherein the output signal of the sensor structure is to be modulated by changes in at least one secondary stimulus to which the apparatus is subjected, and wherein the calibration structure is to exhibit an output signal that is responsive to changes in the at least one secondary stimulus that modulate the output signal of the sensor structure.

Example 9 includes all features of example 8, wherein the calibration structure is at least partially homologous to the sensor structure.

Example 10 includes all features of example 8, wherein an electronic circuit is to be operable to differentially receive a first input signal from the sensor structure and a second input signal from the calibration structure, wherein the electronic circuit is to be operable to cancel out the modulation by the at least one secondary stimulus of the first input signal, and wherein the electronic circuit is to exhibit an output signal that corresponds to a demodulated first input signal from the sensor structure.

Example 11 includes all features of example 8, further comprising at least one cavity formed within said substrate.

Example 12 includes all features of example 11, wherein the sensor and calibration structures are integrated within the at least one cavity.

Example 13 includes all features of example 12, wherein the sensor and calibration structures are integrated within the at least one cavity in a vertically stacked configuration.

Example 14 includes all features of example 11, wherein the sensor and calibration structures are integrated in a layer overlaying the at least one cavity.

Example 15 includes all features of example 11, wherein the sensor and calibration structures are integrated within separate cavities.

Example 16 includes all features of example 8, wherein the sensor structure is an electromechanical structure having an inertial element coupled to the substrate by one or more resonant beams.

Example 17 includes all features of example 8, wherein the calibration structure is a non-inertial electromechanical structure.

Example 18 includes all features of example 17, wherein the calibration structure is at least one resonant beam.

Example 19 is an apparatus that comprises: a substrate having at least one cavity; a sensor structure including a sensing element integrated within the at least one cavity, the sensor structure is to exhibit an output signal corresponding to the state of at least one primary stimulus to which the apparatus is subjected; and a calibration structure integrated within the at least one cavity and adjacent to the sensor structure, wherein the output signal of the sensor structure is to be modulated by changes in at least one secondary stimulus to which the apparatus is subjected, and wherein the calibration structure is to exhibit an output signal that is responsive to changes in the at least one secondary stimulus that modulate the output signal of the sensor structure.

Example 20 includes all features of example 19, wherein an electronic circuit is to be operable to differentially receive a first input signal from the sensor structure and a second input signal from the calibration structure, wherein the electronic circuit is to be operable to cancel out the modulation by the at least one secondary stimulus of the first input signal, and wherein the electronic circuit is to exhibit an output signal that corresponds to the demodulated first input signal from the sensor structure.

Example 21 includes all features of example 19, wherein the sensor and calibration structures are integrated separately in vertically stacked layers disposed within the at least one cavity.

Example 22 includes all features of example 19, wherein the sensor and calibration structures are integrated within the same layer disposed within the at least one cavity, the sensor structure integrated adjacently to the calibration structure.

Example 23 is a system that comprises: a memory; a package including a processor, the package coupled to the memory, wherein the package comprises: a substrate; a sensor including a sensing element, wherein the sensor is integrated within the substrate; a calibration structure integrated within the substrate, wherein the calibration structure is to exhibit one or more properties same as the sensor but without the sensing element; and a wireless interface to allow the processor to communicate with another device.

Example 24 includes all features of example 23, wherein at least one cavity is formed within the substrate.

Example 25 includes all features of example 24, wherein the sensor and calibration structures are integrated within the at least one cavity.

Example 26 includes all features of example 25, wherein the sensor and calibration structures are integrated within the at least one cavity in a vertically stacked configuration.

Example 27 includes all features of example 25, wherein the sensor and calibration structures are integrated in a layer overlaying the at least one cavity.

Example 28 is a method that comprises: providing a substrate; forming a sensor having a sensing element within the substrate; and forming a calibration structure within the substrate, wherein the calibration structure exhibit one or more properties same as the sensor but without the sensing element.

Example 29 includes all the features of example 28, wherein the step of forming a sensor within the substrate comprises forming a sensor operable to exhibit a first indication corresponding to a state of a first stimulus to which the sensor is subjected, wherein the first indication is modulated by changes corresponding to a state of a second stimulus to which the sensor is subjected.

Example 30 includes all the features of example 29, wherein the step of forming a calibration structure within the substrate comprises forming a calibration structure operable to exhibit a second indication corresponding to the state of the second stimulus to which the sensor is subjected.

Example 31 includes all the features of example 28, further comprising forming a circuitry operable to receive a first signal from the sensor and a second signal from the calibration structure.

Example 32 includes all the features of example 29, wherein the step of forming a circuitry operable to receive a first signal from the sensor and a second signal from the calibration structure is further operable to compare the first signal from the sensor to the second signal from the calibration structure and to calibrate the first signal based on the second signal.

Example 33 includes all the features of any of examples 28-32, wherein the step of forming a calibration structure within the substrate, wherein the calibration structure exhibit one or more properties same as the sensor but without the sensing element comprises forming a calibration structure that is at least partially homologous to the sensor.

Example 34 is a method comprising: forming a sensor structure including a sensing element integrated within a substrate, the sensor structure is to exhibit an output signal corresponding to a state of at least one primary stimulus to which the apparatus is subjected; and forming a calibration structure integrated within the substrate.

Example 35 includes all the features of example 34, further comprising forming an electronic circuit to be operable to differentially receive a first input signal from the sensor structure and a second input signal from the calibration structure, wherein the electronic circuit is to be operable to cancel out the modulation by the at least one secondary stimulus of the first input signal, and wherein the electronic circuit is to exhibit an output signal that corresponds to a demodulated first input signal from the sensor structure.

Example 36 includes all the features of example 34, further comprising the step of forming at least one cavity within the substrate.

Example 37 includes all the features of example 36, wherein the step of forming a sensor including a sensing element integrated within a substrate comprises forming the sensor within the at least one cavity within the substrate; and wherein the step of forming a calibration structure integrated within the substrate comprises forming the calibration structure integrated within the at least one cavity within the substrate.

Example 38 includes all the features of example 37, wherein the step of forming the sensor and calibration structure within the at least one cavity comprises integrating the sensor and calibration structure in a vertically stacked configuration within the at least one cavity.

Example 39 includes all the features of example 37, wherein the step of forming the sensor and calibration structure within the at least one cavity comprises integrating the sensor and calibration structures in a layer overlaying the at least one cavity.

Example 40 includes all the features of example 37, wherein the step of forming the sensor and calibration structure within the at least one cavity comprises forming the sensor and calibration structures within separate cavities.

Example 41 includes all the features of any of examples 34-40, wherein the step of forming the sensor comprises forming an electromechanical structure having an inertial element coupled to the substrate by one or more resonant beams.

Example 42 includes all the features of any of examples 34-40, wherein the step of forming the calibration structure comprises forming a non-inertial electromechanical structure.

Example 43 includes all the features of example 42, wherein the step of forming the calibration structure comprises forming at least one resonant beam.

Example 44 is a method comprising: forming at least one cavity in a substrate; forming a sensor structure including a sensing element integrated within the at least one cavity, the sensor structure is to exhibit an output signal corresponding to the state of at least one primary stimulus to which the apparatus is subjected; and forming a calibration structure within the at least one cavity and adjacent to the sensor structure, wherein the output signal of the sensor structure is to be modulated by changes in at least one secondary stimulus to which the apparatus is subjected, and wherein the calibration structure is to exhibit an output signal that is responsive to changes in the at least one secondary stimulus that modulate the output signal of the sensor structure.

Example 45 includes all the features of example 44, further comprising forming an electronic circuit is to be operable to differentially receive a first input signal from the sensor structure and a second input signal from the calibration structure, wherein the electronic circuit is to be operable to cancel out the modulation by the at least one secondary stimulus of the first input signal, and wherein the electronic circuit is to exhibit an output signal that corresponds to the demodulated first input signal from the sensor structure.

Example 46 includes all features of example 44, wherein the step of forming the calibration structure within the at least one cavity and adjacent to the sensor structure comprises integrating the sensor and calibration structures vertically within the at least one cavity.

Example 47 includes all features of example 44, wherein the step of forming the calibration structure within the at least one cavity and adjacent to the sensor structure comprises integration the sensor and calibration structures within the same layer disposed within the at least one cavity, the sensor structure integrated adjacently to the calibration structure.

Example 48 is an apparatus, comprising: a sensing means for sensing a primary stimulus integrated within a substrate; and a calibration means for sensing a secondary stimulus integrated within the substrate adjacent to the sensing means, wherein the calibration means is to exhibit one or more properties same as the sensor means.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package, comprising:
a substrate;
an inertial sensor including a first resonant structure comprising one or more resonant beams attached to a proof mass, the first resonant structure comprises a first material, and wherein the sensor is integrated within the substrate; and
a calibration structure including a second resonant structure integrated within the substrate and adjacent to the inertial sensor, the second resonant structure comprises one or more resonant beams attached to the substrate, the second resonant structure comprising a second material,
wherein the one or more resonant beams of the first resonant structure and the second resonant structure are electrically conductive, and wherein at least one magnetic structure is adjacent to the inertial sensor and the calibration structure.

2. The IC package of claim 1, wherein a cavity is within the substrate, and wherein the one or more resonant beams of the first resonant structure and the second resonant structure are suspended within the cavity.

3. The IC package of claim 2, wherein the inertial sensor and the calibration structure are integrated within the cavity in a vertically stacked configuration, wherein the inertial sensor is substantially over the calibration structure within the cavity, and wherein the magnetic structure is over or laterally adjacent to the inertial sensor and the calibration structure.

4. The IC package of claim 1, wherein the one or more resonant beams of the first resonant structure are bonded to a first via at a first end and to the proof mass at a second end, wherein the one or more resonant beams of the second resonant structure are bonded to a second via at a second end and to a third via at a third end, and wherein the first, second and third vias extend into a cavity within the substrate and are electrically coupled to escape routing within the substrate.

5. The IC package of claim 1, wherein a first cavity and a second cavity are within the substrate, wherein the second cavity is adjacent to the first cavity, and wherein the inertial sensor is integrated within the first cavity and the calibration structure is integrated within the second cavity.

6. The IC package of claim 1, wherein the inertial sensor and the calibration structure are coplanar.

7. The IC package of claim 1, wherein the at least one magnetic structure is a permanent magnet or an electromagnet, and wherein the magnetic structure is stacked over or under the inertial sensor and the calibration structure.

8. The IC package of claim 1, wherein the first and second resonant structures comprise a dielectric material and a conductive material.

9. The IC package of claim 8, wherein the conductive material is any one of copper, nickel gold or aluminum.

10. A system comprising:
a memory;
an IC package including a processor, the IC package coupled to the memory, wherein the IC package comprises:
a substrate;
an inertial sensor including a first resonant structure comprising one or more resonant beams attached to a proof mass, the first resonant structure comprises a first material, and wherein the sensor is integrated within the substrate; and
a calibration structure including a second resonant structure integrated within the substrate and adjacent to the inertial sensor, the second resonant structure comprises one or more resonant beams attached to the substrate, the second resonant structure comprising a second material,
wherein the one or more resonant beams of the first resonant structure and the second resonant structure are electrically conductive, and wherein at least one magnetic structure is adjacent to the inertial sensor and the calibration structure;
a wireless interface to allow the processor to communicate with another device;
a power source coupled to the processor and the memory, and
an electronic circuit comprising an alternating voltage or alternating current source coupled to the inertial sensor and the calibration structure.

11. The system of claim 10, wherein the inertial sensor is a gyroscope or an accelerometer.

12. The system of claim 10, wherein the electronic circuit drives an alternating current through the one or more beams of the first resonant structure and the second resonant structure, and wherein the alternating current generates a magnetic flux.

13. The system of claim 12, wherein a first counter-emf and second counter-emf is present across the one or more beams of the first and second resonant structures, respectively, wherein the first counter-emf and the second counter-emf are generated by the magnetic flux concentrated by the magnetic structure and intersecting the conductive material of the one or more beams of the first and second resonant structures.

14. The system of claim 10, wherein the inertial sensor is to exhibit a first indication corresponding to a state of a first stimulus to which the inertial sensor is subjected, and wherein the first stimulus is an acceleration force that is measured by the electronic circuit, and wherein the electronic circuit measures changes in a first resonant frequency of the first resonant structure.

15. The system of claim 14, wherein the first indication is modulated by changes corresponding to a state of a second stimulus to which the inertial sensor is subjected, and wherein the second stimulus is any one of temperature, humidity or mechanical strain, and wherein the electronic circuit measures changes in a second resonant frequency of the second resonant structure.

16. The system of claim 15, wherein the system is configured to compare the change in the first resonant frequency of the first resonant structure to the change in the second resonant frequency of the second resonant structure.

17. The system of claim 16, wherein the system is configured to generate a difference signal by subtracting the change in the second resonant frequency from the change in the first resonant frequency.

* * * * *